US010996268B2

(12) United States Patent
Patel et al.

(10) Patent No.: US 10,996,268 B2
(45) Date of Patent: May 4, 2021

(54) SESSION MANAGEMENT FOR INTERACTIVE DEBUGGING

(71) Applicant: National Instruments Corporation, Austin, TX (US)

(72) Inventors: Kunal Patel, Houston, TX (US); Tobias Gordon, Genoa Township, OH (US); Laura Nayman, Austin, TX (US); Marcos Kirsch, Austin, TX (US); Reid Lee, Cedar Park, TX (US); Tyler Healy, Austin, TX (US)

(73) Assignee: National Instruments Corporation, Austin, TX (US)

( * ) Notice: Subject to any disclaimer, the term of this patent is extended or adjusted under 35 U.S.C. 154(b) by 361 days.

(21) Appl. No.: 15/945,143

(22) Filed: Apr. 4, 2018

(65) Prior Publication Data

US 2019/0310318 A1 Oct. 10, 2019

(51) Int. Cl.
*G01R 31/317* (2006.01)

(52) U.S. Cl.
CPC . *G01R 31/31713* (2013.01); *G01R 31/31724* (2013.01)

(58) Field of Classification Search
CPC ........ G01R 31/31724; G01R 31/31705; G01R 31/31713; G01R 31/31707
See application file for complete search history.

(56) References Cited

U.S. PATENT DOCUMENTS

| 4,701,845 A | 10/1987 | Andreasen |
| 5,889,988 A | 3/1999 | Held |
| 2005/0049814 A1* | 3/2005 | Ramchandani ..... G06F 11/3668 702/123 |
| 2008/0115026 A1* | 5/2008 | Dieffenderfer ... G01R 31/31707 714/733 |
| 2015/0339127 A1 | 11/2015 | Lee |
| 2018/0031609 A1 | 2/2018 | Kisler |

* cited by examiner

*Primary Examiner* — Yoshihisa Ishizuka
(74) *Attorney, Agent, or Firm* — Kowert, Hood, Munyon, Rankin & Goetzel P.C.; Jeffrey C. Hood; Luke S. Langsjoen

(57) ABSTRACT

Methods and measurements systems are disclosed relating to dynamic measurement prioritization by multiple software interfaces. A first software interface with a low priority may be conducting a first measurement on a device under test (DUT) through a driver connected to a measurement device. A second software interface with a higher priority may initiate a request to conduct a second measurement on the DUT. In response, the driver may automatically determine that the second software interface has a higher priority than the first software interface and may halt the first measurement and conduct the second measurement. The driver may notify the first software interface that its access to the measurement hardware has been revoked, and the first software interface may enter a monitoring mode to monitor the results of the second measurement.

20 Claims, 11 Drawing Sheets

SESSION MANAGEMENT FOR INTERACTIVE DEBUGGING

TECHNICAL FIELD

The present disclosure is related to signal measurements and more particularly to interactively debugging radio frequency measurements.

DESCRIPTION OF THE RELATED ART

To ensure reliable performance of a product, quality control has become a major part of manufacturing. Therefore, each unit manufactured is tested under a number of conditions to ensure quality. Each test may require a number of instruments to perform a number of measurements and based on the outcome of these measurements, a decision is made to mark the unit as pass or fail. Hence, manufacturing testing plays an important role in ensuring quality products in the marketplace. Manufacturing testing may occur for a plurality of different concurrent measurements, and each measurement may be configured with different measurement configurations. This may present challenges for a user to easily observe, interface with, and debug a complex measurement process.

A user that wishes to perform signal measurements may use hardware and software measurement systems to control certain aspects of the signal measurements. One option for interacting with a measurement system is via a user interface, such as soft front panel (SFP), and a user may additionally employ automation code to test and debug aspects of the device being tested. However, using these disparate interfaces may result in a poor user experience. Accordingly, improvements in this area may be desirable.

SUMMARY

Embodiments described herein relate to computer systems, memory media, and methods for dynamic measurement prioritization by multiple software interfaces on a device under test (DUT).

A first software interface with a low priority may be conducting a first measurement on a DUT through a driver implemented by a measurement device. A second software interface with a higher priority may initiate a request to conduct a second measurement on the DUT. In response, the driver may automatically determine that the second software interface has a higher priority than the first software interface and may halt the first measurement and conduct the second measurement. The driver may notify the first software interface that its access to the measurement hardware has been revoked, and the first software interface may enter a monitoring mode to monitor the results of the second measurement.

Note that the techniques described herein may be implemented in and/or used with a number of different types of devices, including but not limited to base stations, access points, cellular phones, portable media players, tablet computers, wearable devices, RF semiconductor components, RF power amplifiers, Front End Modules, transceivers, and various other computing devices.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the disclosed embodiments can be obtained when the following detailed description of the preferred embodiments is considered in conjunction with the following drawings.

Figure 1A:
FIG. 1A illustrates a computer system, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Terminology

The following is a glossary of terms used in the present document.

Device Under Test (DUT)—A physical device or component that is being tested.

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Multiprocessor System—a computer system that includes multiple processing elements, i.e., processors, processing cores, or even networked computers, that may operate in a coordinated manner to execute program instructions concurrently.

Concurrently—a manner of performing actions or processes such that at least a portion of the (concurrent) processes overlap in time, e.g.,, at least one of the processes executes at least one iteration while another process executes an iteration. Concurrence, as used herein, may be accomplished in any of multiple ways, including through the use of single processor systems, e.g., via multi-threading, time-slices, etc., or multiprocessor (or multicore) systems, as well as any other technique for processing functions at the same time.

Function—a discrete set of one or more steps that form at least a part of a process.

Acquisition—refers to the acquiring of analog signals and converting the analog signals to digital data, e.g., bits.

Measurement Data Sets—the digital data resulting from an acquisition, including the "raw" digital bits and/or the digital bits converted via some scaling to any of a variety of formats, including voltages and other engineering units.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "graphical user interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window, panel, or dialog box having one or more GUI Elements, or may comprise a plurality of individual GUI Elements (or individual windows each having one or more GUI Elements), wherein the individual GUI Elements or windows may optionally be tiled together.

Graphical User Interface Element—an element of a graphical user interface, such as for providing input or displaying output. Exemplary graphical user interface elements include input controls and output indicators.

Input Control—a graphical user interface element for providing user input to a program. Exemplary input controls include buttons, check boxes, input text boxes, knobs, sliders, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data from a DUT. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

User Equipment (UE) (or "UE Device")—any of various types of computer systems devices which are mobile or portable and which performs wireless communications, such as mobile wireless devices. Examples of UE devices include mobile telephones (e.g., cellular telephones ("cell phones")) or smart phones (e.g., iPhone™, Android™-based phones), portable gaming devices (e.g., Nintendo DS™, PlayStation Portable™, Gameboy Advance™, iPod™), laptops, tablets (e.g., iPad™, Android™-based tablets), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

DETAILED DESCRIPTION

FIG. 1A: Computer System

FIG. 1A illustrates a computer system 82 configured to implement various embodiments. More specifically, the computer system 82 may be configured to execute one or more programs, e.g., one or more graphical data flow programs, to execute a measurement function (for example, in some embodiments, to test one or more devices under test (DUTs)), where the measurement function (or equivalently, "measurement") may be initiated by one or more software interfaces via a driver coupled to a measurement device, and wherein results of the measurement function may be displayed on a display via a soft front panel, as described below in detail.

In some embodiments, a single measurement function may measure a plurality of separate quantities. For example, a measurement function may measure both an amplitude and a frequency of a cellular radio transmission. A single measurement function that measures multiple separate quantities may be referred to herein as a 'composite measurement.' Alternatively or additionally, a measurement function may change or alter the configuration of the DUT.

According to some embodiments, a user may be allowed to preconfigure which traces and/or results may be displayed on a SFP for each measurement and/or for specific composite measurement combinations. Note that what the SFP displays may be independent of which traces and/or results are enabled in the application or which results and traces are fetched by the application. These defined configurations may be used when the user switches to a measurement or combination of measurements in the SFP or when displaying measurement results in Monitoring mode.

As shown in FIG. 1A, the computer system 82 may include a display device. In some embodiments, the computer system 82 may be configured to display a (possibly graphical) program as the program is created and/or executed. The display device may also be configured to display a graphical user interface, a soft front panel of the program during execution of the program, interactive software, automation code, and/or other types of software interfaces. The graphical user interface may comprise any type of graphical user interface, e.g., depending on the computing platform.

The computer system 82 may include at least one memory medium on which one or more computer programs or software components according to one embodiment may be stored. The memory may be coupled to one or more processors and store program instructions executable by the one or more processors. For example, the memory medium may store one or more programs, e.g., graphical programs, drivers, interactive software, automation code, and/or soft front panels, which are executable to perform embodiments of the methods described herein. Additionally, the memory medium may store a programming development environment application used to create and/or execute such programs. The memory medium may also store operating system software, as well as other software for operation of the computer system. Various embodiments further include receiving or storing instructions and/or data implemented in accordance with the foregoing description upon a carrier medium.

Figure 1B:
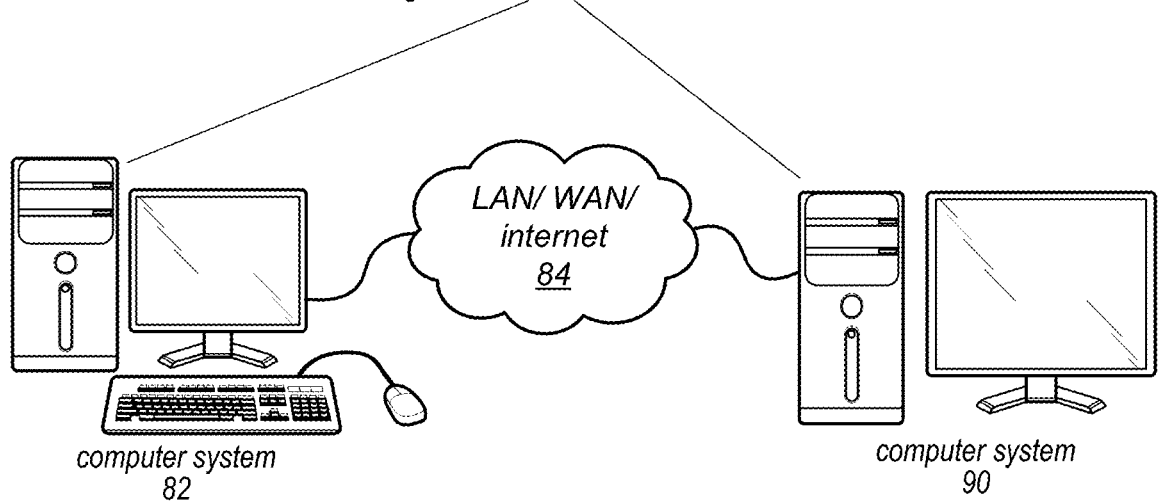
FIG. 1B illustrates a network system, according to one embodiment.

FIG. 1B: Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute programs, e.g., one or more software interfaces, in a distributed fashion. For example, computer 82 may execute a first software interface (e.g., a soft front panel) and computer system 90 may execute a second software interface (e.g., automation code).

Figure 2:
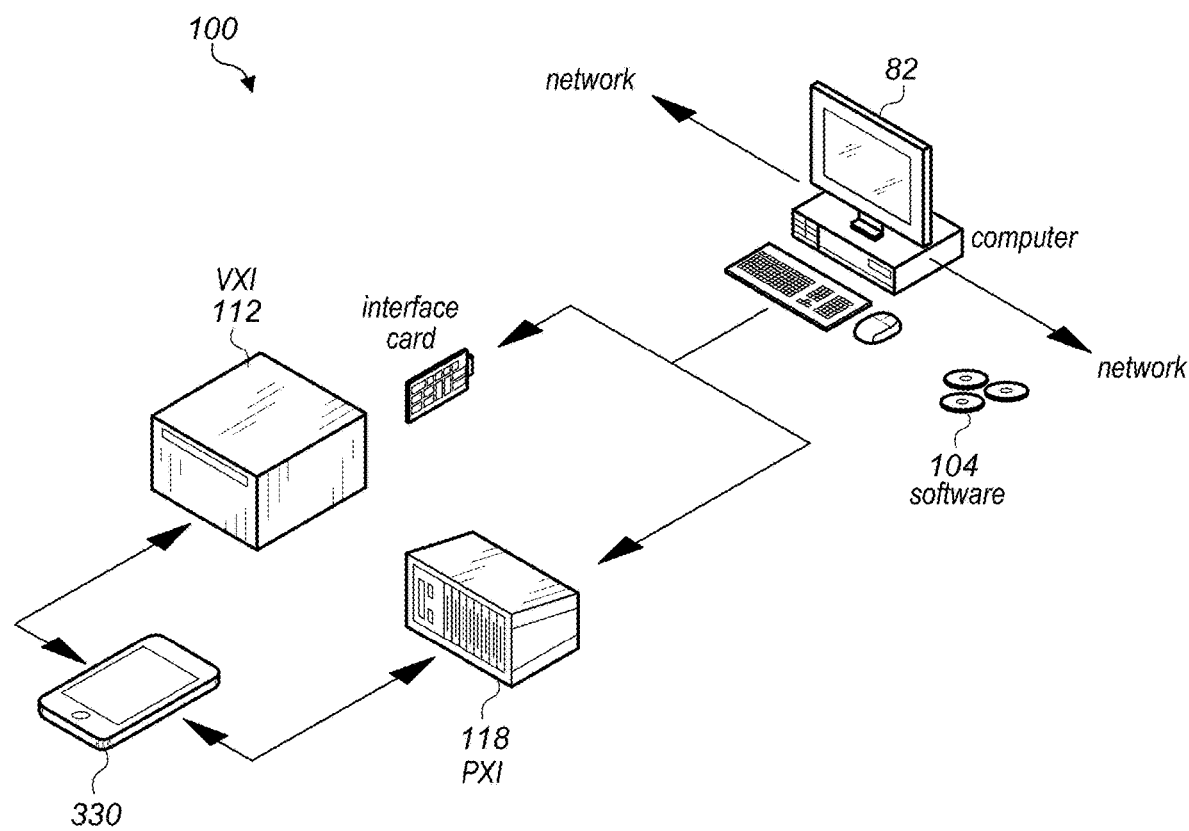
FIG. 2 is a schematic diagram showing a typical measurement setup, according to some embodiments.

FIG. 2—Exemplary Measurement System

FIG. 2 illustrates an exemplary measurement system that is configured to employ embodiments presented herein. A computer 82 may be used by a user to conduct the measurement process and may be connected to a network and to the measurement apparatus. Software 104 may be installed on the computer to conduct the delay measurement process (e.g., using one or more software interfaces). The computer 82 may be connected to any of a variety of signal generating apparatuses, according to various embodiments. For example, the computer may be connected to a PXI 118 with configurable interface cards. Alternatively or additionally, the computer may be connected to a VXI 112 that is configured with interface cards. The PXI 118 and/or the VXI 112 may serve as waveform generators to supply a signal to the Device Under Test (DUT) 330. The VXI and/or PXI may further function as a vector signal analyzer (VSA), to receive and analyze an output signal from the DUT. As described herein, any of the PXI 118, the VXI 112, and/or any other hardware device that is configured to interface with the DUT under the direction of the computer 82 may be considered a measurement device, as defined above. The DUT may be any of a variety of electronic devices for which a measurement function is desirable. It should be noted that a DUT may be any of various types of computer systems devices which are mobile or portable and which performs wireless communications, such as mobile wireless devices. Examples of DUTs include mobile telephones (e.g., cellular telephones ("cell phones") or smart phones, portable gaming devices, laptops, tablets, PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

In some embodiments, the signal generator and/or signal analyzer may be comprised within the computer 82, which may be directly connected to the DUT 330. A soft front panel, interactive software, and/or automation code, according to embodiments described herein, may be configured to display on a display device of the computer 82 (e.g., on a monitor or other display device).

In some embodiments, separate devices may be used to perform some of the functions (e.g. the AWG, VSG, VSA, etc.) described above. These dedicated devices, which may be known in the art as "box" type instruments, may also be connected to a computer system. In some embodiments, the connected computer system may be configured to receive outputs from or provide inputs to the dedicated instruments. The connected computer system may also, in some embodiments, collect and store data or display outputs from the devices.

In one embodiment, the system may include a memory, e.g., a non-transitory computer accessible memory medium, coupled to one or more processors, where the memory stores program instructions which may be executable by the one or more processors to implement embodiments of the testing method disclosed herein.

Figure 3:
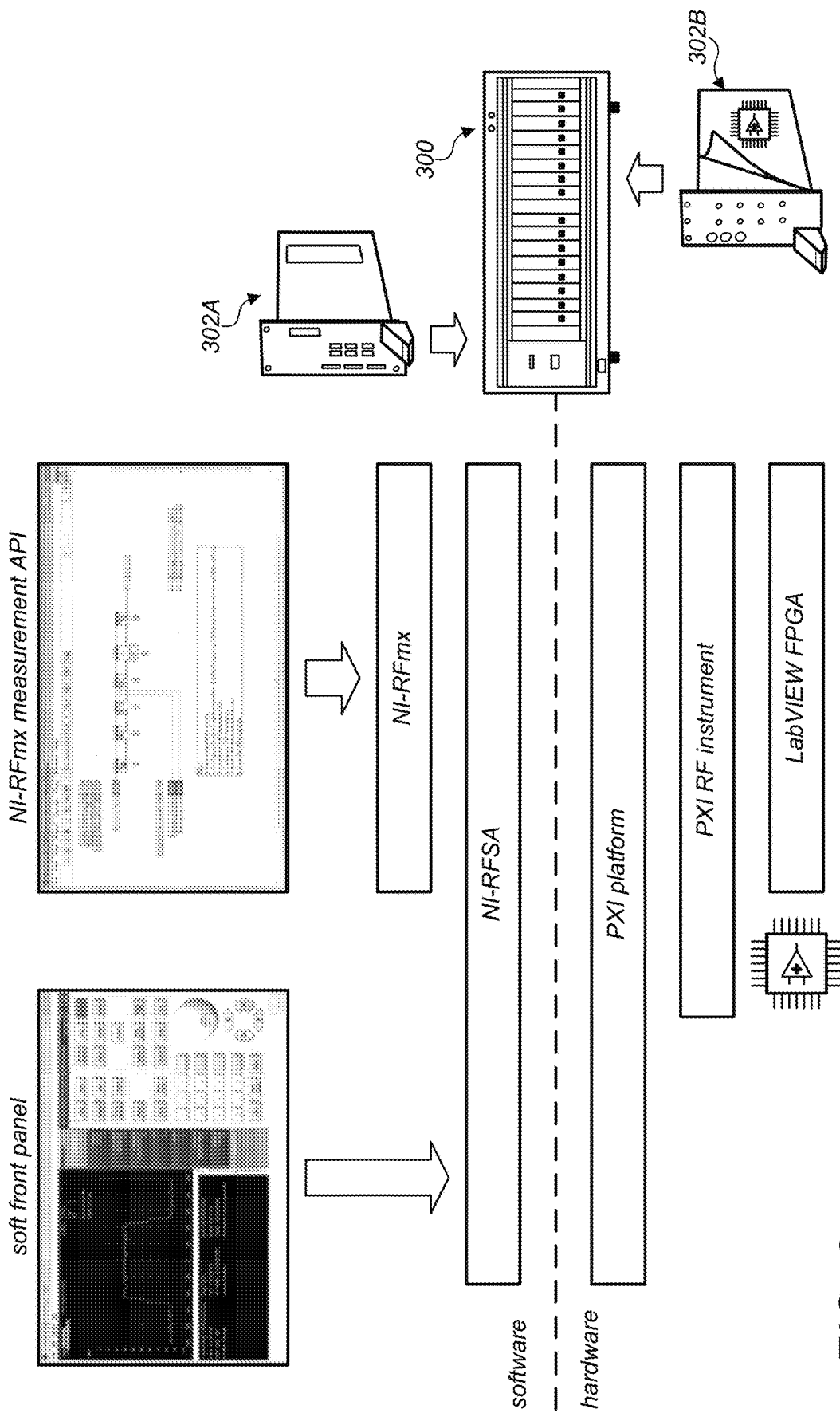
FIG. 3 illustrates an example measurement system, according to some embodiments.

FIG. 3—Example Measurement System with Soft Front Panel

FIG. 3 illustrates an example measurement system, according to some embodiments. The measurement system may include software features, such as a soft front panel (SFP) that may communicate with a measurement application programming interface (API) (e.g., a NI-RFmx measurement API as shown in the illustrated example) through a signal analyzer (e.g., a NI-Radio Frequency Signal Analyzer, or NI-RFSA, as shown in the illustrated example). The measurement system may additionally include hardware features, such as a PCI extensions for instrumentation (PXI) platform 300, a PXI radio frequency (RF) instrument 302A, and a LabVIEW field-programmable gate array (FPGA) 302B. FIG. 3 additionally illustrates that the PXI platform may be an instrument chassis 300 that may include one or more hardware modules, such as a PXI RF instrument 302A or an FPGA 302B. Note that the software and hardware listed above and/or depicted in FIG. 3 are examples only, and aspects of the present disclosure may be implemented on other hardware and software systems.

The API may include one or more features that may be exposed by the SFP. For example, in monitoring mode, a SFP may display the configuration and results for measurements that are being executed in an automated test program (e.g., automation code) running in a different process. Monitoring mode may typically be used when the automated test program is executing and not stopped at a breakpoint. However, monitoring mode may also be used when a user is stepping through or otherwise executing their automated test code, allowing a user to see the configuration and results without having to manually switch the automation code into and out of a monitoring mode at each step.

Session Management for Interactive Debugging

Figure 4:
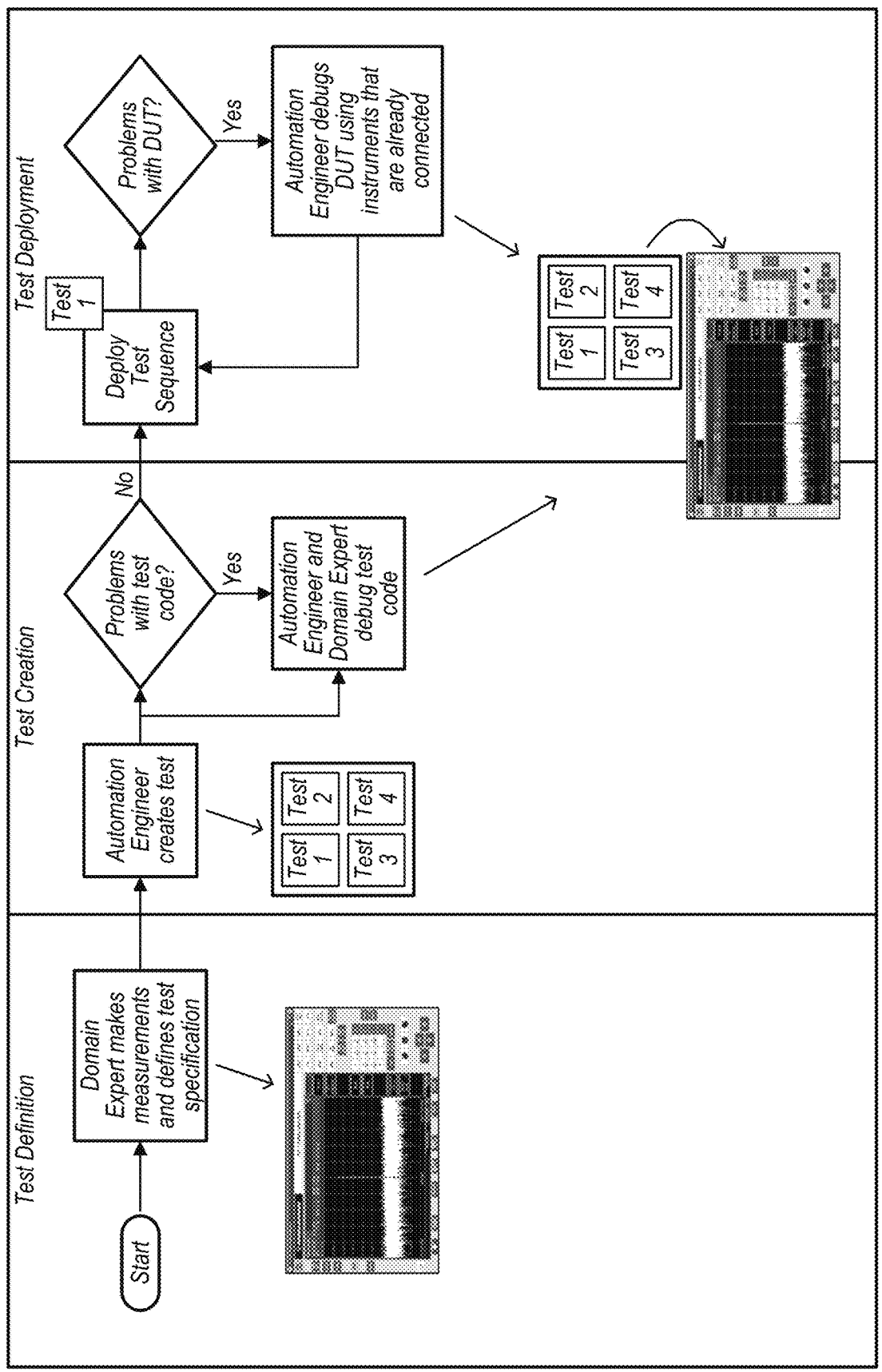
FIG. 4 is a diagram illustrating a method for defining, creating, and deploying a test sequence, according to the prior art.
Figure 5:
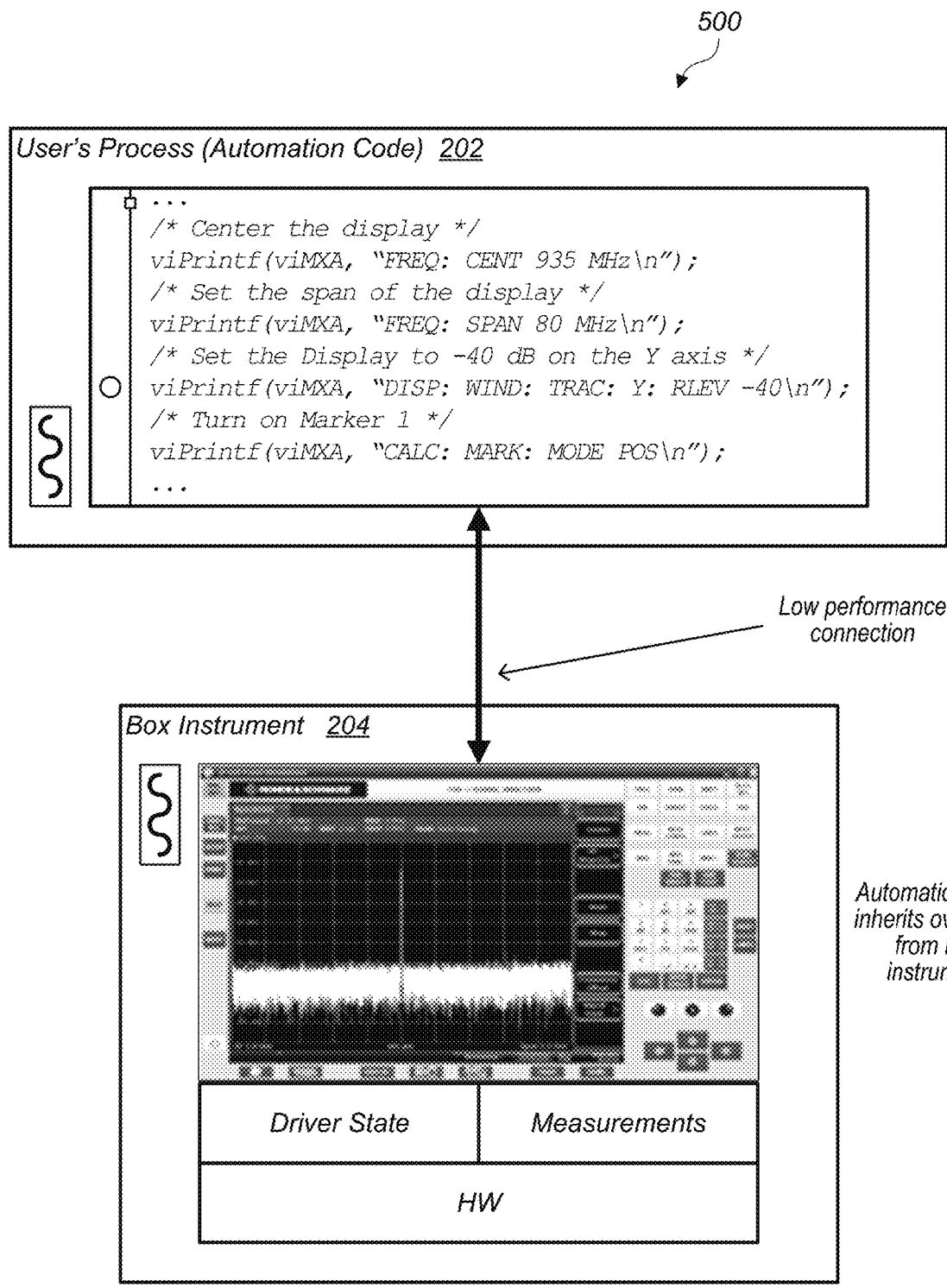
FIG. 5 is a diagram illustrating a low performance connection between automation code and a box instrument, according to the prior art.

Embodiments herein describe a method and a computer system designed to implement a method for interactively debugging an automation application that allows for the convenience of debugging (e.g., like a 'box' instrument), but without compromising the performance of the automation code. In current implementations, interactive software and box instruments may be used during multiple phases of test development. For example, as illustrated in FIG. 4, the usage may initiate with the definition of a test and may extend through the debugging of a deployed application. FIG. 4 illustrates a method for performing test measurements and debugging on a DUT, according to some embodiments. As illustrated, a domain expert may make measurements on a DUT and define specifications for a test measurement. An automation engineer may create the test measurement and run the test measurement on the DUT to see if there are any problems (e.g., coding bugs) within the test code. If there are, the automation engineer and the domain expert may debug the test code. Once the test measurement has been successfully debugged, the test measurement may be deployed on the DUT to identify problems with the functionality of the DUT. If any problems are identified, the automation engineer may debug the DUT using hardware connected to the DUT (e.g., by running additional tests and changing operational parameters of the DUT). While the method described in FIG. 4 may be able to perform effective debugging using box instruments, it may also result in a significant increase of test times. The test time increase may result from the architecture of box instruments. For example, while the debugging process may be straightforward, the box architecture may push much of the programming of the hardware into another process or out of the computer completely, which may slow test times. For example, as illustrated in FIG. 5, the data connection between a user's automation code (User's Process 202) and a box instrument 204 may be a lower performance (e.g., slower) connection than exists between software interfaces within a single computer system, such that the automation code may inherit additional latency from having to communicate changes and test code to the box instrument. An additional issue that may arise in such embodiments is that users may have to manually manage session ownership for debugging workflows, as the user's programmatic code and the SFP may not both be able to own the measurement session to a single physical device. This management may provide a pain point for customers that may hinder widespread adoption of the debugging methodology.

Embodiments described below include a method that allows real-time debugging that removes the usability issues discussed above without a significant increase in test time. In some embodiments, a driver is implemented that handles registration of sessions across processes. All session creators (e.g., customer code such as automation code and/or soft front panels (SFPs)) may register with this driver. During registration, each session creator may declare a priority and a policy of closing their respective session that restricts the scope of automatic closure (e.g. the policy may specify that automatic closure may occur in response to a subsequent initiation of any process, just a process of the session creator, or for no subsequent processes). The driver may also register a method of closure (e.g. a function pointer to close). In some embodiments, user sessions may get registered with a normal priority while SFP sessions may get registered with a low priority and may be closable by initiation of any subsequent process. Alternatively, the user sessions may be registered with a high priority versus a default priority of the SFP sessions. In general, the user process (e.g., an automation process) may have a higher priority than the SFP sessions.

When a user runs an application (e.g., automation code) while a SFP is running with the real hardware, the driver may close the SFP session to the hardware (using cross process communication) and then successfully create a new session for the user application.

The driver may also provide a cross process method of querying all open sessions with their associated priorities. The SFP may use this information to automatically transition into a monitoring mode. This monitoring mode of the SFP may now be able to reflect the state of the user's automation program.

Figure 6:
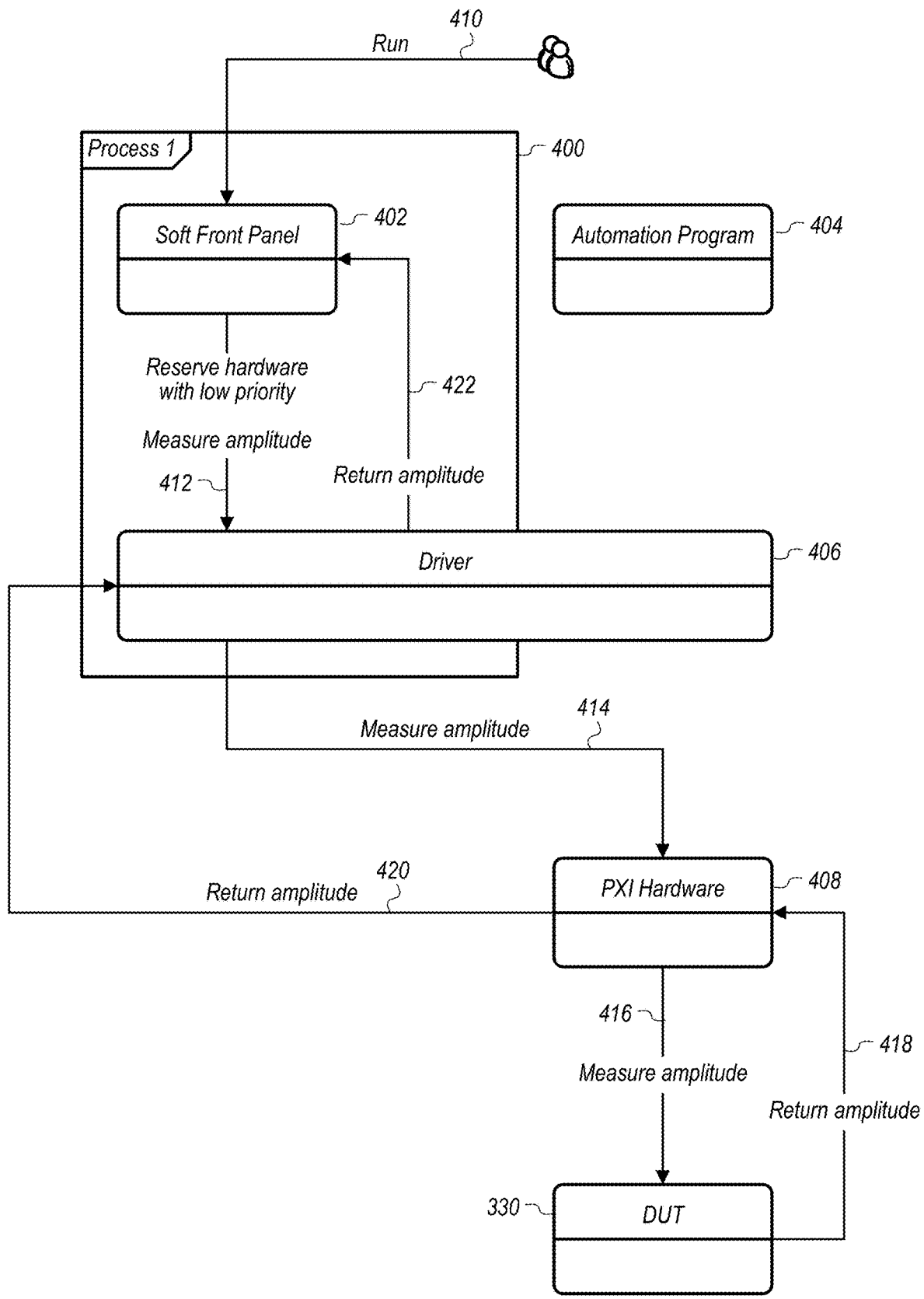
FIG. 6 is a method diagram illustrating a simple amplitude measurement of a device under test (DUT) by a soft front panel, according to some embodiments.
Figure 7:
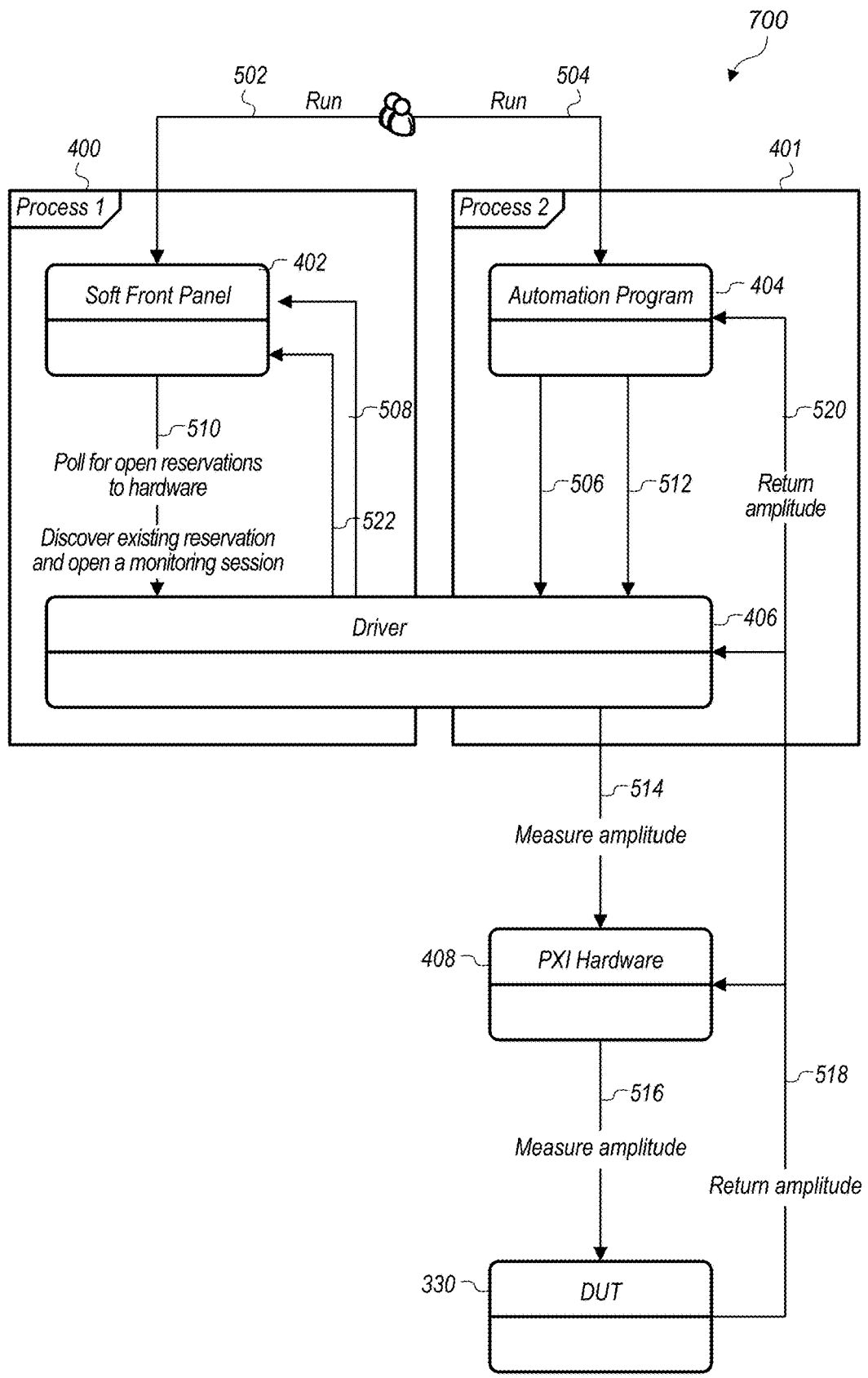
FIG. 7 is a method diagram illustrating an automation program dynamically obtaining access to measure a DUT during a concurrent measurement by a soft front panel, according to some embodiments.

FIGS. 6-7—Workflow for Automatic Session Management and Debugging

FIGS. 6-7 are workflow diagrams illustrating a method for conducting automatic and dynamic session management for a measurement system, according to some embodiments. FIGS. 6-7 illustrate a specific example involving an amplitude measurement of a DUT, but it may be understood that the methods described herein may be performed more generally for any kind of measurement or measurement function performed by a measurement device on a DUT. FIGS. 6 and 7 further illustrate a specific example where the first and second software interfaces are a soft front panel 402 and an automation program 404, respectively, and where the measurement device is PXI hardware 408. However, this is merely to present a particular example and is not intended to limit the scope of the disclosure, as the first and second software interfaces and the measurement device may more generally be other kinds of software interfaces and measurement devices. FIG. 6 is a communication flow diagram illustrating a method for interactive software to make a basic measurement (process 1, 400) of a device-under-test (DUT). As illustrated, in response to input from a user at 410, a first software interface (soft front panel 402) may reserve PXI hardware 408 through a driver 406 to measure an amplitude from the DUT. The DUT may return the amplitude, through the PXI hardware 408 and the driver 406, to the soft front panel 402.

FIG. 7 illustrates automatic session management, wherein a second process 401 is initiated by a second software interface (automation program 404) while the first process 400 is being conducted. Advantageously, a user may initiate a second process without having to manually manage hardware reservation for conducting the measurement process. Rather, embodiments herein may automatically manage measurement hardware reservations, with priority given to user automation code over soft front panel interactive software. During the operation of the process described in reference to FIG. 6, the automation program may reserve the PXI hardware 408 with normal priority at 506, thus overriding the low priority reservation previously implemented by the soft front panel 402. The driver 406 may notify the soft front panel 402 that the soft front panel's reservation has been lost (508), and in response the soft front panel may query the driver 510 for open reservations to the PXI hardware, and may thereby discover an existing hardware reservation and open a monitoring session to monitor measurements of the new measurement function (i.e., process 2).

The automation program may then instruct the driver to measure an amplitude 512, and the driver may direct the PXI hardware to conduct the measurement function on the DUT. The DUT may return the measured amplitude 518 to the PXI hardware, which may thereby return the measurement to the driver. The driver may then return the measured amplitude to the automation program at 520 and/or the soft front panel at 522. The automation program may maintain a high speed connection with the measurement device, thus improving testing and debugging time.

As described in FIG. 7, and as described in further detail below, when a user attempts to run automation code while interactive software (or another software interface with a lower priority than the automation code) is currently making a measurement, the driver may automatically transition the hardware reservation to the automation code (ensuring the automation application will run in a timely manner), according to some embodiments. At the same time, e.g., in response to the automation code taking priority over the interactive software via the driver, the interactive software may enter a monitoring mode, to monitor the measurement(s) initiated by the automation code. Advantageously, a user may seamlessly transition between running user code and debugging interactively without having to manually conduct session management or losing test time performance.

Figure 8A:
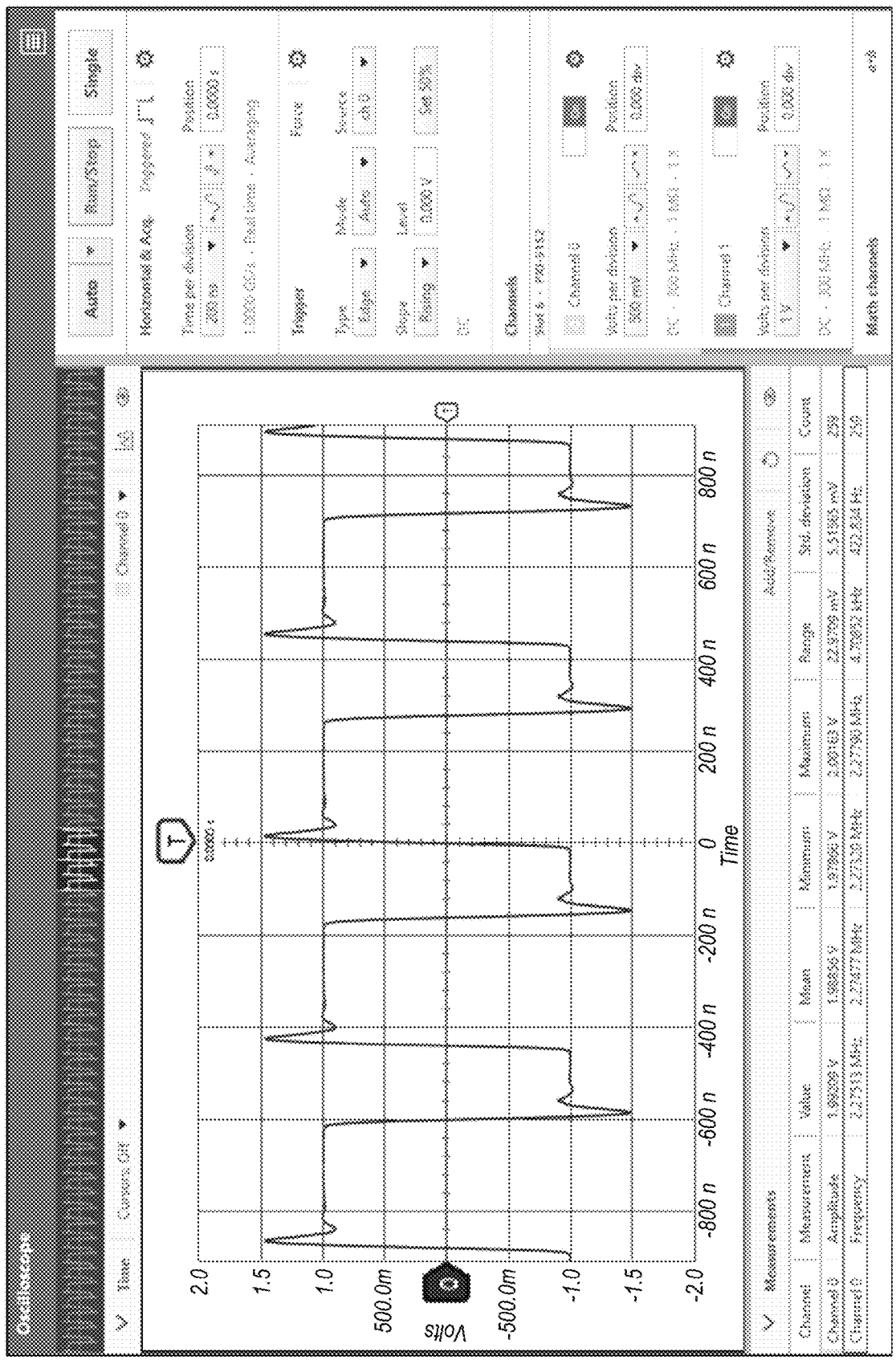
FIGS. 8A-8C are screen shots illustrating how initiation of automation code transitions a soft front panel from a measurement mode to a monitoring mode, according to some embodiments.
Figure 8B:
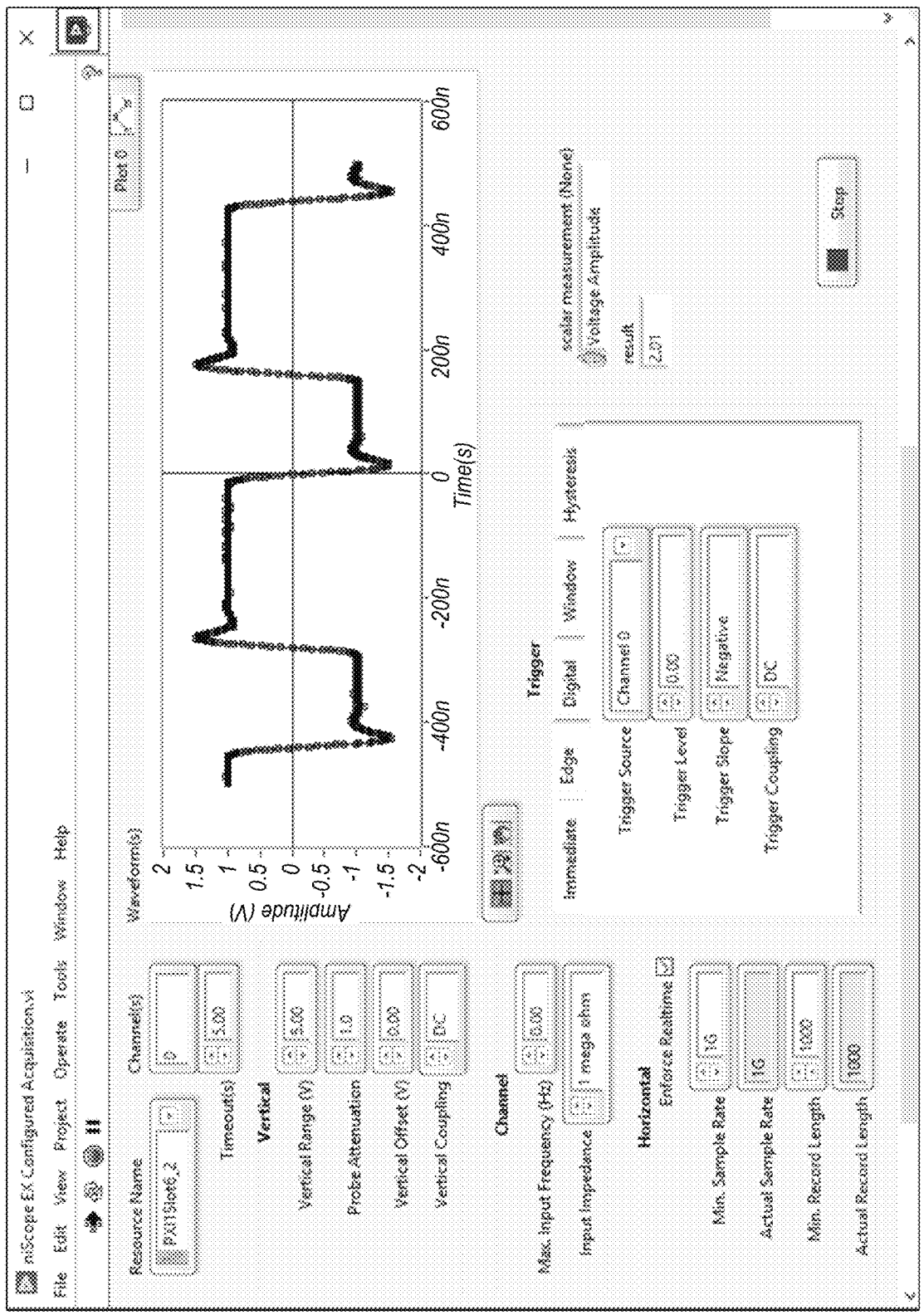
Figure 8C:
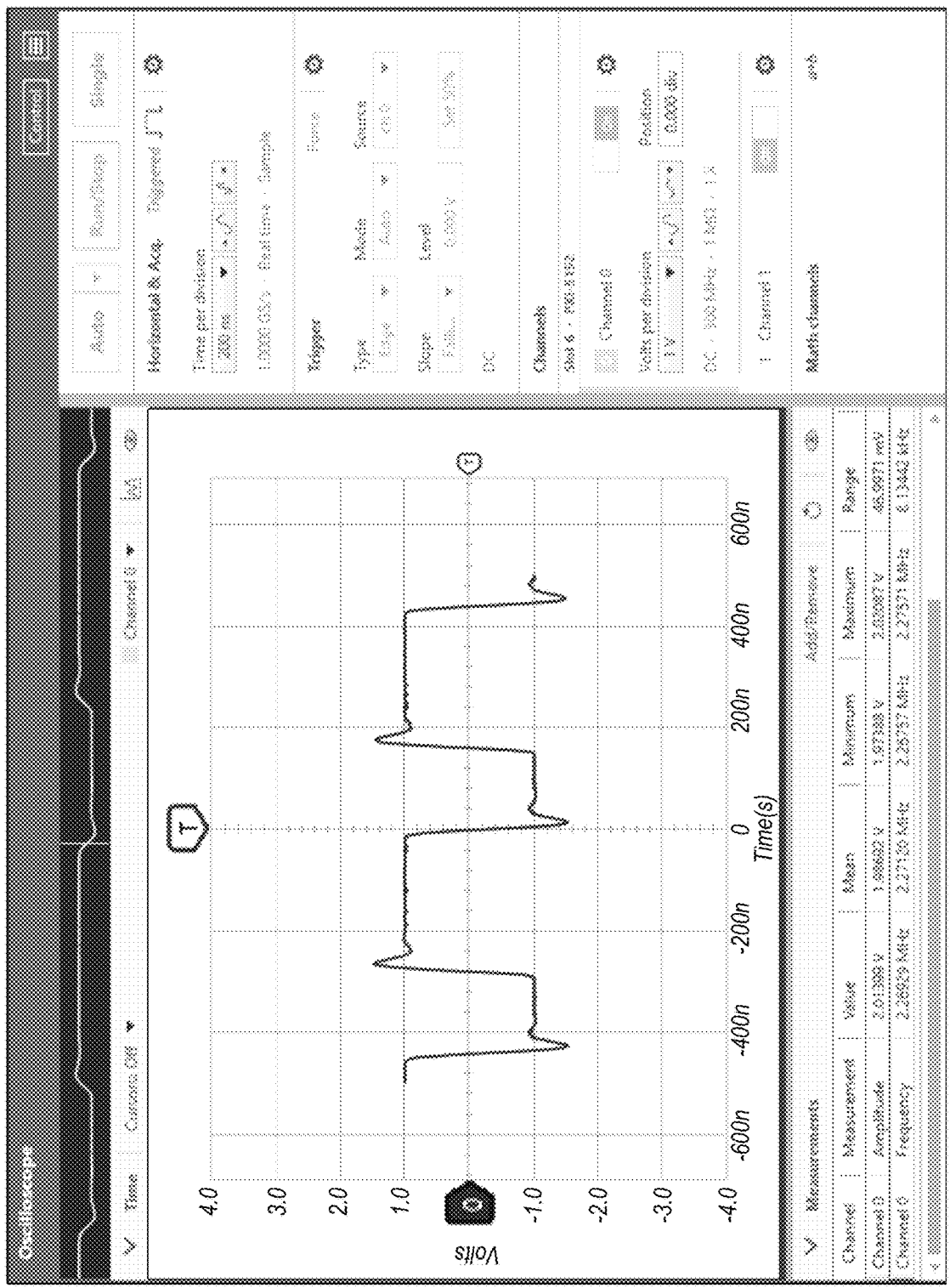

FIGS. 8A-8C—Initiation of Automation Code and Monitoring Mode of SFP

FIGS. 8A-8C illustrate how implementation of automation code may be reflected on a soft front panel (SFP) as the SFP switches from a measurement mode to a monitoring mode upon initiation of the automation code. Specifically, FIG. 8A shows an interactive SFP in measurement mode conducting an amplitude measurement on the rising edge of an input signal. In other words, the SFP illustrated in FIG. 8A is conducting a measurement such that the beginning of the measurement (i.e., when the time equals zero) occurs as the amplitude is rising. FIG. 8B shows automation code that is initiated to conduct a slightly different amplitude measurement on the falling edge of an input signal. In other words, FIG. 8B shows that the automation code initiates a measurement wherein the amplitude is falling when the time equals zero. FIG. 8C shows the SFP transitioned into monitoring mode, wherein the SFP is automatically monitoring the measurements performed by the automation code and reflecting the falling edge measurement that the automation code is conducting.

Figure 9:
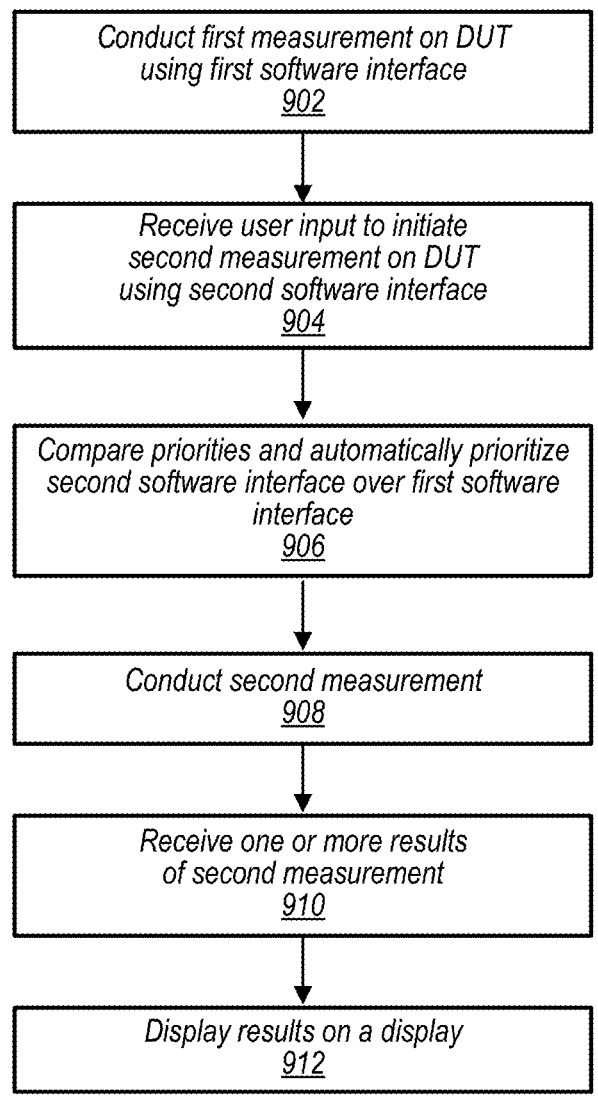
FIG. 9 is a flow chart diagram illustrating a method for dynamically conducting measurement session management, according to some embodiments.

FIG. 9—Dynamic Software Interface Prioritization

FIG. 9 is a flowchart diagram illustrating a method for dynamically and automatically prioritizing a software interface for performing a measurement function on a device under test (DUT), according to some embodiments. The method of FIG. 9 may provide additional details that may apply to the Figures and examples discussed above. A computer system may have a memory medium comprising program instructions executable by a processor of the computer system to implement the described method. The program instructions may be program instructions for a first software interface, a second software interface, and/or the driver, which may each be configured to implement one or more steps of the described method. Some of the method elements shown may be performed concurrently, in a different order than shown, or may be omitted. Additional method elements may also be performed as desired. As shown, the method may operate as follows.

At 902, a computer system (e.g., such as the computer system 82) may conduct a first measurement on a DUT using a first software interface. The first measurement may be conducted in response to first instructions received from the first software interface. In one exemplary embodiment, the first measurement may be initiated by the first software interface, which may be a soft front panel (SFP), such as InstrumentStudio. In other embodiments, the first software interface may be any of a variety of software interfaces, including other user code, automation code, etc. The first software interface may be configured to interface with a driver of the computer system and may transmit instructions specifying parameters of the first measurement to the driver (e.g., parameters of a measurement are described above in reference to measurement functions). The driver may be configured to interface with and direct a measurement device, which may be connected to the DUT. In response to receiving the instructions from the first software interface to conduct the first measurement, the driver may direct the measurement device to conduct the first measurement according to the specified parameters on the DUT.

At 904, during the first measurement, the computer system may receive user input to initiate a second measurement on the DUT using a second software interface. For example, user input may be received through the second software interface to initiate the second measurement. In response, the second software interface may transmit instructions to the driver to conduct the second measurement according to specified parameters. In some embodiments, the second software interface may be user-initiated automation code.

At 906, in response to receiving the instructions from the second software interface to conduct the second measurement, the driver may compare a priority associated with each of the first and second software interfaces, e.g., by consulting a register or other stored information regarding the first and second software interfaces. For example, each of the first and second software interfaces may have previously registered a respective priority ranking with a register of the driver. In some embodiments, a SFP software interface may be registered with a low priority, while an automation code software interface may be registered with a normal, higher priority (e.g., automation code may be granted a higher priority than a SFP). Alternatively, the SFP may have a default or normal priority, and the automation code may have a higher priority. In some embodiments, both the first software interface and the second software interface may be user code (e.g., automation code), but may have different priorities; accordingly, in 906, the driver may determine which user code has priority (in the embodiment of FIG. 9, the second software interface).

In response to determining that the second software interface has a higher priority than the first software interface, the driver may automatically prioritize the second software interface over the first software interface. In some embodiments, automatically prioritizing the second software interface over the first software interface may involve revoking access (e.g., interactive or two-way access) of the first software interface to the measurement hardware. In some embodiments, removing this access may halt the first measurement; however, in other embodiments, the measurement may continue, but the first software interface may no longer access interaction with the measurement.

At 908, as a result of automatically prioritizing the second software interface over the first software interface, the driver may direct the measurement device to conduct the second measurement on the DUT. The second measurement may be conducted according to the parameters specified by the second software interface. In some embodiments, the second measurement may replace the first measurement. Alternatively, the second measurement may modify the first measurement to conform to the desired parameters, as desired.

At 910, the measurement device may transmit one or more results of the second measurement back to the driver. The driver may then transmit the one or more results of the second measurement back to the second software interface.

In some embodiments, in response to prioritizing the second software interface over the first software interface, the first software interface may transition into a monitoring mode. For example, the first software interface may be configured to transition into a monitoring mode in response to detecting that its access to the measurement device has been revoked, and/or that the first measurement has been halted.

In transitioning into a monitoring mode, the first software interface may determine whether a software interface currently has priority access to the driver to perform measurements on the DUT. For example, the first software interface may query the driver to determine whether the second software interface has gained priority access to the driver (e.g., to the measurement device through the driver) and/or whether a second measurement is being conducted on the DUT. In response to determining that the second software interface has been granted priority access to the measurement device through the driver and/or that the second measurement is currently being conducted, the first software interface may monitor for results of the second measurement. For example, the driver may transmit the one or more results of the second measurement to the first software interface in response to being queried (or otherwise requested) by the first software interface. Alternatively, the driver may simply provide output of the measurement to both the first software interface and the second software interface concurrently. The first software interface may receive the one or more results of the second measurement from the driver while the first software interface is in the monitoring mode.

At 912, the computer system may display the one or more results of the second measurement on a display. In some embodiments, the one or more results of the second measurement may be displayed on the display through the second software interface, or (e.g., if the first software interface is configured to operate in a monitoring mode and is receiving the results of the second measurement through the driver) through the first software interface, as desired. Alternatively, the driver may transmit the one or more results of the second measurements to another (third) software interface to display the results.

In some embodiments, the computer system may receive second user input to change the parameters of the second measurement. For example, second user input may be received through the second software interface to change parameters of the second measurement. In these embodiments, the second software interface may transmit instructions to the driver to change the parameters of the second measurement, and the driver, in response, may automatically direct the measurement to conduct the second measurement on the DUT according to the change in parameters.

In some embodiments, the second user input may be based at least in part on the one or more results of the second measurement. For example, the one or more results of the second measurement may be displayed on a display at step 912, above, and a user of the computer system may observe that an amplitude of the second measurement is clipping on the display. The user may then determine to alter the parameters of the second measurement (e.g., the user may lower a sensitivity of the second measurement to reduce the likelihood of experiencing clipping in the measurement), and may enter second user input to specify the altered parameters. Advantageously, these embodiments may allow real-time (or near real-time) debugging of programmed measurements in automation code by seamlessly displaying measurement results on a first software interface, while simultaneously allowing a user to alter parameters of the measurement through a second software interface without aborting and restarting the measurement process.

In some embodiments, the driver may detect that the second measurement is complete. For example, the driver may receive a notification from the measurement device or from the second software interface that the second measurement is complete. In response to detecting that the second measurement is complete, the driver may automatically prioritize the first software interface over the second software interface. Automatically prioritizing the first software interface over the second software interface may include revoking priority access of the second software interface to the measurement device through the driver and granting priority access of the first software interface to the measurement device through the driver. Once priority access has been granted to the first software interface, the first software interface may exit monitoring mode and may resume the first measurement on the DUT.

Embodiments of the present disclosure may be realized in any of various forms. For example, in some embodiments, the disclosed techniques may be realized as a computer-implemented method, a computer-readable memory medium, or a computer system. In other embodiments, the disclosed techniques may be realized using one or more custom-designed hardware devices such as ASICs. In other embodiments, the disclosed techniques may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms. For example, the computer system may be a personal computer (in any of its various realizations), a workstation, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A non-transitory computer accessible memory medium that stores a driver executable by a processor of a computer system to cause the computer system to:
    receive first instructions from a first software interface to conduct a first measurement on a device under test (DUT) using a measurement device;
    direct the measurement device to conduct the first measurement on the DUT in response to receiving the first instructions;
    during the first measurement, receive second instructions from a second software interface to conduct a second measurement on the DUT using the measurement device;
    determine that a priority of the second software interface is higher than a priority of the first software interface;
    in response to the determination that the priority of the second software interface is higher than the priority of the first software interface, automatically halt the first measurement and direct the measurement device to conduct the second measurement on the DUT;
    receive one or more results of the second measurement;
    transmit the one or more results of the second measurement to the second software interface; and
    cause the one or more results to be displayed on a display of the computer system.

2. The non-transitory computer accessible memory medium of claim 1, wherein the driver is further executable by the processor to cause the computer system to:
    receive a querying request from the first software interface to monitor the second measurement; and
    in response to the querying request, transmit the one or more results of the second measurement to the first software interface.

3. The non-transitory computer accessible memory medium of claim 1, wherein the driver is further executable by the processor to cause the computer system to:
    receive third instructions from the second software interface to change the parameters of the second measurement; and automatically conduct the second measurement on the DUT according to the change in parameters at least in part in response to receiving the third instructions.

4. The non-transitory computer accessible memory medium of claim 3,
wherein the third instructions are based at least in part on the one or more results of the second measurement.

5. The non-transitory computer accessible memory medium of claim 1, wherein the driver is further executable by the processor to cause the computer system to:
detect that the second measurement is complete; and
in response to detecting that the second measurement is complete, automatically resume the first measurement on the DUT.

6. The non-transitory computer accessible memory medium of claim 1,
wherein the first software interface is a soft front panel (SFP), and wherein the second software interface is an automation program.

7. A method, comprising:
by a computer system:
conducting a first measurement on a device under test (DUT) through a first software interface using a measurement device;
during the first measurement, receiving user input to initiate a second measurement on the DUT through a second software interface using the measurement device, wherein each of the first software interface and the second software interface are registered with a driver of the computer system to have respective priority rankings;
based at least in part on the user input and further based at least in part on the second software interface being registered with a higher priority ranking than the first software interface, automatically performing:
halting the first measurement; and
conducting the second measurement through the second software interface on the DUT using the measurement device;
receiving, by the second software interface, one or more results of the second measurement; and
displaying the one or more results of the second measurement on a display.

8. The method of claim 7, the method further comprising:
in response to receiving the user input, transitioning the first software interface into a monitoring mode;
receiving, by the first software interface, the one or more results of the second measurement while the first software interface is in the monitoring mode.

9. The method of claim 8,
wherein transitioning the first software interface into a monitoring mode comprises determining, by the first software interface, whether a software interface currently has priority access to the driver of the computer system to use the measurement device to perform measurements on the DUT; and
wherein the one or more results of the second measurement are received by the first software interface from the driver while the first software interface is in the monitoring mode.

10. The method of claim 7, the method further comprising:
based at least in part on the user input, automatically granting access by the second software interface to the driver of the computer system that is connected to the measurement device, wherein the second measurement is initiated, via the driver, by the measurement device on the DUT.

11. The method of claim 7, the method further comprising:
receiving second user input to change the parameters of the second measurement; and
automatically conducting the second measurement on the DUT using the measurement device according to the change in parameters at least in part in response to receiving the second user input.

12. The method of claim 11,
wherein the second user input is based at least in part on the one or more results of the second measurement.

13. The method of claim 7, the method further comprising:
detecting that the second measurement is complete; and
in response to detecting that the second measurement is complete, automatically resuming the first measurement on the DUT using the measurement device.

14. The method of claim 7,
wherein the first software interface is a soft front panel (SFP), and wherein the second software interface is an automation program.

15. A computer system, comprising:
a non-transitory computer readable memory medium comprising program instructions for a first software interface, a second software interface and a driver, wherein each of the first software interface and the second software interface are registered with the driver to have respective priority rankings;
a display;
a processor coupled to the non-transitory computer readable memory medium and the display;
wherein the processor is configured to execute the program instructions to cause the computer system to:
direct a measurement device to conduct a first measurement on a device under test (DUT) using the first software interface;
during the first measurement, receive user input through the second software interface to direct the measurement device to initiate a second measurement on the DUT;
based at least in part on the user input and further based at least in part on the second software interface having a higher priority ranking than the first software interface, automatically halt the first measurement and conduct the second measurement on the DUT using the measurement device;
receive one or more results of the second measurement; and
display the one or more results of the second measurement on the display.

16. The computer system of claim 15, wherein the computer system is further configured to:
further based at least in part on the user input, transition the first software interface into a monitoring mode;
transmit the one or more results of the second measurement to the first software interface while the first software interface is in the monitoring mode.

17. The computer system of claim 16,
wherein transitioning the first software interface into a monitoring mode comprises querying, by the first software interface, the driver of the computer system for a software interface that currently has priority to perform measurements on the DUT; and wherein the one or more results of the second measurement are received by the first software interface from the driver.

18. The computer system of claim 15, wherein the processor is further configured to execute the program instructions to cause the computer system to:
further based at least in part on the user input, grant access by the second software interface to the driver of the computer system that is connected to the measurement device,
wherein the second measurement is initiated, via the driver, by the measurement device on the DUT.

19. The computer system of claim 15, wherein the computer system is further configured to:
receive second user input to change the parameters of the second measurement, wherein the second user input is based at least in part on the one or more results of the second measurement; and
automatically direct the measurement device to conduct the second measurement on the DUT according to the change in parameters at least in part in response to receiving the second user input.

20. The computer system of claim 15,
wherein the first software interface is a soft front panel (SFP), and wherein the second software interface is an automation program.

* * * * *